United States Patent [19]
Lieber et al.

[11] Patent Number: 6,036,774
[45] Date of Patent: Mar. 14, 2000

[54] METHOD OF PRODUCING METAL OXIDE NANORODS

[75] Inventors: Charles M. Lieber, Lexington; Peidong Yang, Somerville, both of Mass.

[73] Assignee: President and Fellows of Harvard College, Cambridge, Mass.

[21] Appl. No.: 08/790,824

[22] Filed: Jan. 22, 1997

Related U.S. Application Data

[63] Continuation-in-part of application No. 08/606,892, Feb. 26, 1996, Pat. No. 5,897,945.

[51] Int. Cl.[7] .................................................. C30B 29/16
[52] U.S. Cl. ............................. 117/105; 117/84; 117/106; 117/109; 117/921
[58] Field of Search .............................. 117/84, 105, 106, 117/109, 921

[56] References Cited

U.S. PATENT DOCUMENTS

| | | | |
|---|---|---|---|
| 3,361,681 | 1/1968 | Westdorp | 423/345 |
| 3,668,062 | 6/1972 | Shyne et al. | 117/921 |
| 3,674,455 | 7/1972 | Dugger | 117/921 |
| 3,711,599 | 1/1973 | Brubaker . | |
| 3,951,677 | 4/1976 | Jacobson et al. . | |
| 4,505,877 | 3/1985 | Miyata et al. | 423/635 |
| 4,778,716 | 10/1988 | Thorfinnson et al. . | |
| 5,158,643 | 10/1992 | Yoshinaka et al. | 423/229 |
| 5,381,753 | 1/1995 | Okajima et al. | 117/921 |
| 5,418,007 | 5/1995 | Debe . | |
| 5,441,726 | 8/1995 | Mitchnick et al. . | |
| 5,569,445 | 10/1996 | Fukatsu et al. . | |

FOREIGN PATENT DOCUMENTS

| | | |
|---|---|---|
| 0 530 440 | 3/1993 | European Pat. Off. . |
| 61-122198 | 6/1986 | Japan . |
| 62-123100 | 6/1987 | Japan . |

OTHER PUBLICATIONS

Yang and Lieber, "Nanorod–Superconductor Composites: A Pathway to Materials with High Critical Current Densities," *Science*, 273:1836–1840, 1996.

Adamopoulos et al., "An experimental study of flux pinning and flux dynamics. . . " Physica C 242 pp. 68–80, 1995.

Budhani et al., "Giant Suppression of Flux–Flow Resistivity . . . " Physical Review Letters, vol. 69, No. 26, pp. 3816–3819, Dec. 28, 1992.

Civale et al., "Vortex confinement by Columnar Defects . . . " Physical Review Letters vol. 67, No. 5, pp. 648–651, Jul. 29, 1991.

Fossheim et al., "Enhanced flux pinning . . . " Physica C 248, pp. 195–202, 1995.

Hayashi et al., "Growth of . . . " Journal of Materials Science 22, pp. 1305–1309, 1987.

Hwa et al., "Flux Pinning and Forced Vortex Entanglement by Splayed Columnar Defects" Physical Review Letter, vol. 71, No. 21, pp. 3545–3548, Nov. 22, 1993.

(List continued on next page.)

*Primary Examiner*—Robert Kunemund
*Attorney, Agent, or Firm*—Fish & Richardson P.C.

[57] ABSTRACT

Methods of preparing metal oxide nanorods are described. The metal oxide nanorods have diameters between 1 and 200 nm and aspect ratios between 5 and 2000. The methods include the steps of generating a metal vapor in a furnace, exposing the nanorod growth substrate to the metal vapor within a growth zone in the furnace for a sufficient time to grow metal oxide nanorods on a surface of the nanorod growth substrate, removing the nanorod growth substrate from the growth zone after the sufficient time to grow metal oxide nanorods on a surface of the nanorod growth substrate, and removing the metal oxide nanorods from the furnace. The methods can be used to prepared large quantities of metal oxide nanorods.

34 Claims, 2 Drawing Sheets

OTHER PUBLICATIONS

Krusin–Elbaum et al., "Enhancement of persistent currents . . ." Appl. Phys. Lett. 64 (24), pp. 3331–3333, Jun. 13, 1994.

Kummeth et al., "Enhancement of Critical Current Density . . ." Journal of Alloys and Compounds, 195, pp. 403–406, 1993.

Le Doussal et al., "Towards engineering of splayed columnar defects in type II superconductors." Physica C 232 pp. 69–74, 1994.

Levitt, "Whisker Technology." John Wiley & Sons, Inc., 1970.

Lieber et al., "Growth and Structure of Carbide Nanorods." Presented at the Materials Research Society, Boston Nov. 27, 1995.

Miu et al., "Bose–glass behavior of the vortex system in epitaxial . . ." Physical Review B vol. 51, No. 6, pp. 3953–3956, Feb. 1, 1995.

Nelson et al., "Boson Localization and Pinning by Correlated Disorder . . ." Physical Review Letters, vol. 68, No. 15, pp. 2398–2401, Apr. 13, 1992.

Nomura et al., "Fabrication conditions and superconducting properties of Ag–sheathed . . ." Appl. Phys. Lett. 62 (17), pp. 2131–2133, Apr. 26, 1993.

Sharma et al., "Growth of ZnO Whiskers, Platelets, and Dendrites." Journal of Applied Physics, vol. 42, pp. 5302–5304, 1971.

Wolff et al., "Growth and Morphology of Magnesium Oxide Whiskers." Journal of the American Ceramic Society, vol. 48, No. 6, pp. 279–285, Jun. 21, 1995.

Wong et al., "Processing–Microstructure . . ." J. Am. Ceram. Soc., 77 (11) pp. 2833–40, 1994.

Yuan et al., "Whisker/matrix interface and microstructure . . ." J. Mater. Res., vol. 11, No. 1, pp. 18–27, Jan. 1996.

Yuan et al., "Superconducting properties of MgO–whisker reinforced BPSCCO composite." Physica C 250 pp. 247–255, 1995.

Yuan et al., "Solid–state processing and phase development of bulk . . ." J. Mater. Res., vol. 11, No. 1, pp. 8–17, Jan. 1996.

Zhu et al., "In situ growth of epitaxial . . ." Appl. Phys. Lett. 63 (3), pp. 409–411, Jul. 19, 1993.

METHOD OF PRODUCING METAL OXIDE NANORODS

CROSS REFERENCE TO RELATED APPLICATIONS

This application is a continuation-in-part of U.S. Ser. No. 08/606,892, filed Feb. 26, 1996 now U.S. Pat. No. 5,897, 945.

STATEMENT AS TO FEDERALLY SPONSORED RESEARCH

This invention was made with support from the National Science Foundation (MRSEC, Grant No. DMR-94-00396) and the Department of Navy (Grant No. N00014-94-1-0302). Accordingly, the U.S. government may have certain rights to the invention.

BACKGROUND OF THE INVENTION

The invention relates to metal oxide nanoscale materials and composite materials based on the metal oxide nanoscale materials.

Metal oxide whiskers are rod-shaped materials having diameters typically greater than or equal to 1 $\mu$m are used extensively in composites due to their high strength and tolerance of high temperatures. Metal oxide whiskers in the same diameter range have been produced by a variety of procedures. Materials with nanometer diameters are useful in particular material applications, such as magnetic information storage and pinning structures in superconductors. Quantum phenomena are expected from materials in the nanometer size regime. Metal carbide nanomaterials, some being rod-shaped, with diameters between 2 and 100 nm have been reported.

SUMMARY OF THE INVENTION

The invention relates to metal oxide nanorods, composite materials containing metal oxide nanorods, and methods of preparing metal oxide nanorods. The metal oxide nanorods have diameters between 1 and 200 nm and aspect ratios between 5 and 2000.

The metal oxide nanorods, including nanorods of MgO, $Al_2O_3$, and ZnO, can be produced by controlled vapor-solid growth processes using a metal vapor source, such as a mixture of a bulk metal oxide powder and carbon powder, and a low concentration of oxygen gas. Both bulk nanorods and nanorods aligned relative to substrate surfaces can be produced. Because the size regime for these metal oxide nanoparticles is smaller than that of traditional whiskers, we term the materials nanorods. The reduction in size leads to materials with improved properties. For example, it is known that strength increases with decreasing diameter in this class of materials.

In one aspect, the invention relates to a metal oxide nanorod where the metal component contains a metal (e.g., one or more) selected from the group consisting of titanium, zirconium, hafnium, vanadium, niobium, tantalum, chromium, molybdenum, tungsten, manganese, technetium, rhenium, iron, osmium, cobalt, nickel, copper, zinc, scandium, yttrium, lanthanum, a lanthanide series element (e.g., cerium, praseodymium, neodymium, promethium, samarium, europium, gadolinium, terbium, dysprosium, holmium, erbium, thulium, ytterbium, and lutetium), boron, aluminum, gallium, indium, thallium, silicon, germanium, tin, lead, magnesium, calcium, strontium, and barium. The metal oxide nanorod has a narrow dimension (diameter) and a long dimension (length). Since the particles are nanorods, the narrow dimension of the particle is between 1 and 200 nm, more preferably between 2 and 50 nm. The nanorod can be further described by the aspect ratio (the ratio of the length to the diameter), which is preferably between 5 and 2000. Lengths are generally greater than 1 micrometer.

In examples, the metal oxide nanorod contains a metal component selected from the group consisting of magnesium, aluminum, zinc, cadmium, iron, and nickel. In other examples, the metal oxide nanorod is aligned relative to the surface of a substrate or a single crystal substrate. In certain examples, the nanorods are perpendicular to the surface, meaning that the nanorods are aligned within 15° of the substrate surface normal.

The metal oxide nanorod can be contained in a matrix material such as organic polymers, glass, ceramics, metals, or mixtures thereof. For example, the metal matrix may be a Ni/Al alloy or $MoSi_2$. In examples, the matrix material is a superconductor such as low temperature superconducting materials (e.g., Nb, NbTi, $Nb_3Sn$, or amorphous MoGe) or a high temperature copper oxide superconductor (e.g., $Bi_2Sr_2CaCu_2O_{8+x}$ (BSCCO-2212), $Bi_2Sr_2Ca_2Cu_3O_{10+x}$ (BSCCO-2223), $YBa_2Cu_3O_{7+x}$, $Tl_2Ba_2Ca_2Cu_3O_{10+x}$ (Tl-2223), $Tl_2Ba_2CaCu_2O_{8+x}$ (Tl-2212), $TlBa_2CaCu_2O_z$ (Tl-1212), $TlBa_2Ca_2Cu_3O_z$ (Tl-1223), $HgBa_2CaCu_2O_{6+x}$ (Hg-1212), or $HgBa_2Ca_2Cu_3O_{8+x}$ (Hg-1223)). In a composite formed on a substrate, the metal oxide nanorods can be aligned nearly perpendicular to the surface of the substrate.

Another aspect of this invention relates to a method of producing metal oxide nanorods. The method involves the following three steps. First, a powdered metal vapor source is placed in a furnace (e.g., a tube furnace), which can have a carrier gas flowing from one end of the furnace to the opposite end of the furnace. The carrier gas consists of an inert gas (e.g., argon, helium) and oxygen. The oxygen can be present as a trace amount in the furnace or the carrier gas. The preferred oxygen concentration in the carrier gas is between 1 and 10 ppm. Second, a nanorod growth substrate is placed in the furnace, for example, downstream of the metal vapor source, within a 100° C. temperature gradient of the metal vapor source, or within a growth zone. Finally, the contents of the furnace are heated so that the temperature (e.g., the set point temperature) of the metal vapor source is between 500° C. and 1600° C. for up to two hours, generally between approximately 5 minutes and 2 hours. The temperature is maintained for a sufficient time to form metal oxide nanorods on a surface of the nanorod growth substrate. Growth of the nanorods can be halted by cooling the metal vapor source. Alternatively, the substrate can be removed from the growth zone after the growth of the metal oxide nanorods. The metal oxide nanorods are collected and removed from the furnace.

In another aspect, the invention features a method of producing metal oxide nanorods. First, a metal vapor is generated in a furnace, such as a tube furnace. Next, a nanorod growth substrate is exposed to the metal vapor within a growth zone in the furnace for a sufficient time to form metal oxide nanorods on a surface of the nanorod growth substrate. After the sufficient time to grow metal oxide nanorods on a surface of the nanorod growth substrate has passed, the nanorod growth substrate is removed from the growth zone. The metal oxide nanorods are collected and removed from the furnace. The nanorod growth substrate preferably can be a metal oxide nanocluster, a single crystal, graphite, or a metal coated substrate.

In yet another aspect, the invention features a method of producing magnesium oxide nanorods by placing a magnesium vapor source in a furnace, providing a nanorod growth substrate in the furnace, generating a magnesium vapor in the furnace by heating the magnesium vapor source (e.g., magnesium oxide and carbon powder) to a temperature between 500° C. and 1600° C., exposing the nanorod growth substrate to the magnesium vapor within a growth zone in the furnace for a sufficient time to grow magnesium oxide nanorods on a surface of the nanorod growth substrate, removing the nanorod growth substrate from the growth zone after the exposing step, and collecting the magnesium oxide nanorods thus formed.

In examples, the nanorod growth substrate can be moved through the growth zone during the sufficient time to grow the metal oxide nanorods. The metal oxide nanorods can be purified by mechanically separating the metal oxide nanorods from the substrate (e.g., using a porous membrane). In examples where a graphite substrate is used, the metal oxide nanorods can be purified by heating the metal oxide nanorods in an oxidizing atmosphere to convert the graphite to carbon dioxide.

In examples, the metal vapor source includes an elemental metal or a mixture of metal oxide and carbon. The nanorod growth substrate, which is a substrate capable of supporting nanorod growth, contributes to the size of the nanocluster. The nanorod growth substrate may include metal oxide nanoclusters, a single crystal surface, graphite (e.g., carbon), a metal coated substrate (e.g., a substrate coated with a noble metal, such as gold, silver, copper, or platinum), a surface of the metal vapor source, or combinations thereof. The single crystal surface can be a film on a substrate or the surface of a bulk crystal. All of the nanorod growth substrates have the common feature of having or forming nanosized nucleation sites for growing the nanorods. The single crystal surface can be etched to form the nanosized nucleation sites or may form nanosized nucleation sites in situ. The nanorods may be encapsulated in a matrix material to form a composite.

As used herein, the term "nanorod" means a solid article having a narrow dimension (diameter) and a long dimension (length), where the ratio of the long dimension to the narrow dimension (the aspect ratio) is at least 5. In general, the aspect ratio is between 10 and 2000. By definition, the narrow dimension of the nanorod is a diameter between 1 and 200 nm. Accordingly, the length of the nanorod is between 0.01 and 400 $\mu$m. The nanorods are solid structures composed, at least partially, of a metal oxide. The nanorods are single crystals. The term "narrow dimension," or alternatively "diameter," means the shortest dimension or cross-sectional thickness of a nanorod. Generally, the diameter of the nanorod is essentially constant along the length of the particular nanorod. The term "long dimension," or alternatively "length," means the longest dimension of the nanorod that is generally orthogonal to the diameter of the nanorod.

The phrase "nanosized nucleation site" means a site capable of initiating growth of a nanorod, such as on the surface of a nanorod growth substrate. Examples include etch pits in the surface of single crystals, metal coated substrates, nanoclusters, and combinations thereof. In graphite substrates, the nanosized nucleation site can form in situ under the reaction conditions. The phrase "aligned relative to a substrate" means that a majority (greater than 50%) of the nanorods extend in the same general direction from the surface of the substrate. For example, the (100) surface of a single crystal MgO substrate supports growth of MgO nanorods aligned perpendicular to the substrate surface. "Aligned perpendicular" means that the nanorods are within 15° of making a 90° angle with the substrate surface. The term "downstream" means that the substrate is positioned relative to the metal vapor source so that the carrier gas delivers metal vapor to the substrate. Generally, this means that the substrate is located beyond the metal vapor source in the direction that the carrier gas is flowing through the furnace. "Downstream" is further intended to describe that the substrate is in a lower temperature region of the furnace. There is a temperature gradient between the metal vapor source and the substrate.

As used herein, the "growth zone" is a region within a 100° C. temperature drop between a location of highest temperature (or highest metal vapor concentration) and the location of the substrate. The substrate is located within a 100° C. temperature gradient of the metal vapor source.

The invention may provide one of the following advantages. The nanorods may have unique metallic, semiconducting, insulating, superconducting, optical, or magnetic properties, or a combination thereof. Some embodiments have a lower density of stacking faults, as measured by TEM and normalized to diameter, than prior larger materials. The nanorods are highly anisotropic.

The metal oxide nanorods (e.g., magnesium oxide nanorods) can be grown on a carbon or graphite substrate. The carbon substrate is relatively inexpensive and requires no pretreatment for nanorod growth, can be readily removed from the nanorods by oxidation to yield pure metal oxide nanorods, can lead to higher yield of nanorods (per unit area of support), and can produce nanorods with larger aspect ratios relative to MgO etched single crystal substrates. In addition, the carbon substrates can be used in scaled-up commercial production of the metal oxide nanorods.

Other features and advantages of the present invention will be apparent from the following detailed description of the invention, and from the claims.

DETAILED DESCRIPTION

Figure 1:
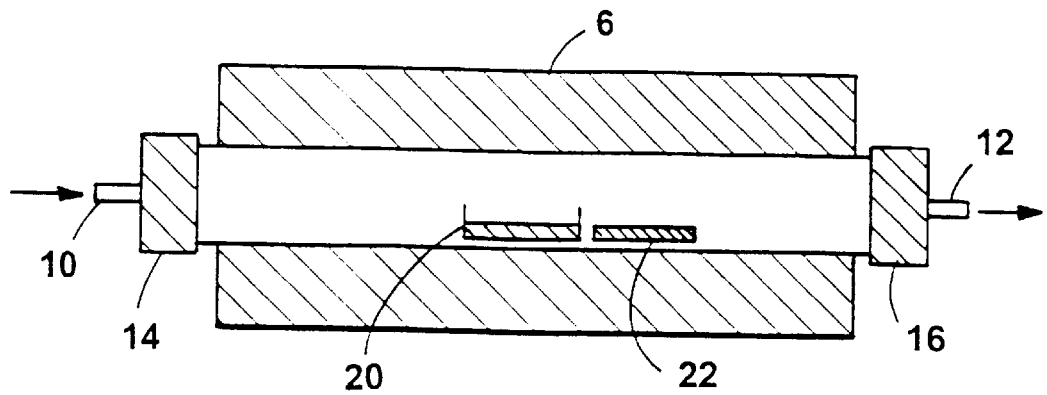
FIG. 1 is a schematic drawing of a batch reactor for growth of metal oxide nanorods.

The invention relates to metal oxide nanorods, methods of preparing metal oxide nanorods, and composite materials containing metal oxide nanorods in a matrix material.

The nanorods are primarily composed of metal oxides of the general formula $M^1_x M^2_y O_z$, where $M^1$ and $M^2$ are metals selected from the group consisting of titanium, zirconium, hafnium, vanadium, niobium, tantalum, chromium, molybdenum, tungsten, manganese, technetium, rhenium, iron, osmium, cobalt, nickel, copper, zinc, scandium, yttrium, lanthanum, a lanthanide series element, boron, aluminum, gallium, indium, thallium, silicon, germanium, tin, lead, magnesium, calcium, strontium, and barium. The ratio of the metal to oxygen depends upon the oxidation state of the metal in the compound. In general, one of x and y, and z are integers greater than zero. That is to say, the compounds are stoichiometric and have few oxygen vacancies. When $M^1$ is the same as $M^2$ (or, alternatively, y is zero), the metal oxide is a binary metal oxide. Particular examples of binary metal oxides include MgO, $Al_2O_3$, and ZnO.

Alternatively, the nanorods have a large number of oxygen vacancies. In effect, the materials are better described as metal doped metal oxides of the formula $M^2:M^1_x O_z$. The metal may be the same or different. In the case where $M^1$ and $M^2$ are the same, the material can be characterized as a metal oxide with an abundance or oxygen vacancies. The materials are metal doped metal oxides. Examples of compounds of this type include Zn:ZnO and In:ZnO. Compounds of this nature are formed, for example, when carrier gases are less oxidizing than in cases where stoichiometric compositions are obtained.

The invention not only encompasses the metal oxide nanorods, but also other composite materials containing the nanorods. The dimensions of the nanorods permit the building of nanostructures and superior composites. For example, the tensile strength ($kg/mm^2$) of the nanorods is greater than that of the corresponding whisker. For example, bulk and film composites consisting of a high-temperature copper oxide superconductor matrix containing MgO nanorods can be prepared. The nanorods are analogous to columnar defects produced previously by ion irradiation, and are found to enhance significantly the critical current density and irreversibility temperature in these materials.

An alternative approach involves making columnar defect structures in materials by adding a pre-formed columnar structure to the superconducting matrix. There are several key criteria for making useful columnar defect structures. The rod-like structure must have a diameter of approximately 10 nm and a length greater than 0.1 $\mu$m. Additionally, the rod-like structure must not be chemically reactive with the superconductor matrix at processing temperatures.

Synthesis of Metal Oxide Nanorods

The general synthetic approach used to prepare metal oxide nanorods involves three fundamental steps. First, a metal vapor must be generated from a metal source which is transported by a carrier gas to the substrate. Second, the metal vapor nucleates on the surface of the substrate. The substrate can be a pre-formed metal oxide nanocluster or single crystal defect site. Alternatively, the nucleation site can form in situ in the reactor, for example, when the substrate is carbon or graphite. This initiates growth of the metal oxide nanorod. Finally, vapor phase growth of the nanorod takes place. The critical steps essential for the formation of nanorods are the nucleation and growth steps which define the initial size of the metal oxide nanorod and its final diameter.

The metal source must be one that is a volatile source of metal atoms under the reaction conditions. One way to generate a metal vapor is by heating a source containing the elemental metal. Alternatively, carbothermal reduction of bulk metal oxide powder can be used to generate volatile metal vapor. It is important that the carrier gas be composed of an inert gas for transporting the metal vapor to the substrate, and a small component of oxygen gas to make the deposition of metal oxide possible. Commercially available reagents do not generally require pre-treatment before use as long as they are of sufficient purity (>99%). Commercial sources of starting materials and substrates include Aldrich Chemicals, Milwaukee, Wis., Johnson-Mathey, Ward Hill, Mass., and Marketech International, Pittsburgh, Pa.

The temperature profile for growing metal oxide nanorods can be determined from the phase diagram for the components of the nanorod or by experiment. In general, the substrate is placed downstream of the metal vapor source. As a result, there is a temperature gradient between the metal vapor source and the substrate. Preferably, the substrate is located within a 100° C. temperature gradient of the metal vapor source (where the concentration of metal vapor and temperature are highest).

The properties of the nanorods can be determined, for example, by transmission electron microscopy (TEM) to measure crystallographic orientations and stacking fault density, energy-dispersive x-ray fluorescence to measure the composition, x-ray diffraction (XRD) to measure crystal structures, and convergent beam electron diffraction to measure lattice symmetry or the lattice constant a.

The metal oxide nanorods are ideally single crystals and are primarily characterized by crystal structure. The single crystal materials consist of a single crystalline domain.

Without intending to be bound to any theories, it is believed the mechanism of nanorod formation involves vapor-solid growth, where the nanoparticles or etched single crystal surfaces (or other substrates) provide nucleation sites for growth of the nanorods. Alternatively, the nucleating surface, such as the carbon surface in single crystal graphite, has no preformed nanosized nucleation sites. It is believed that the nucleation sites for nanorod growth form in situ either by the deposition of nanoclusters (e.g., MgO) from the vapor phase or by oxidation of the carbon growth surface which produces nanometer scale pits that can function as nucleation sites. The average nanorod diameter is determined in part by the size of the nanoparticles during the bulk synthesis of the nanorods. In order to obtain high densities of aligned nanorods on the surface of a single crystal substrate, it is necessary to freshly etch the surface of the single crystal substrate. This process provides a surface with numerous nanosized sites for nucleation and growth of nanorods, provided there is a good lattice match between the surface of the substrate and the growth plane of the nanorods.

Metal oxide nanorods can be prepared in a horizontal tube furnace batch reactor. Referring to FIG. 1, inert gas (e.g., argon or helium) flows through high-purity quartz tube furnace 6 via inlet 10 and outlet 12 located in end caps 14 and 16, respectively. The inert gas flows over the metal vapor source 20 (e.g., MgO+carbon reactant in graphite boat). The metal oxide nanorods grow on nanorod growth substrate 22 (e.g., a carbon/graphite substrate).

Two approaches to large scale production of nanorods (e.g., magnesium oxide nanorods) utilize different reactor designs to achieve the enhanced production of the material. The reactor designs include: (1) a quasi-continuous batch-mode reactor; and (2) a continuous flow reactor. Both designs have been previously used in the large-scale growth of micron-scale whiskers of several different materials. See, for example, W. H. Sutton, "Principles and Methods for Fabricating Whisker-Reinforced Composite," in *Whisker Technology*, A. P. Levitt, Ed. (Wiley-Interscience, 1970, p. 318 and R. S. Wagner, "VLS Mechanism of Crystal Growth," in *Whisker Technology* p. 82.

Figure 2:
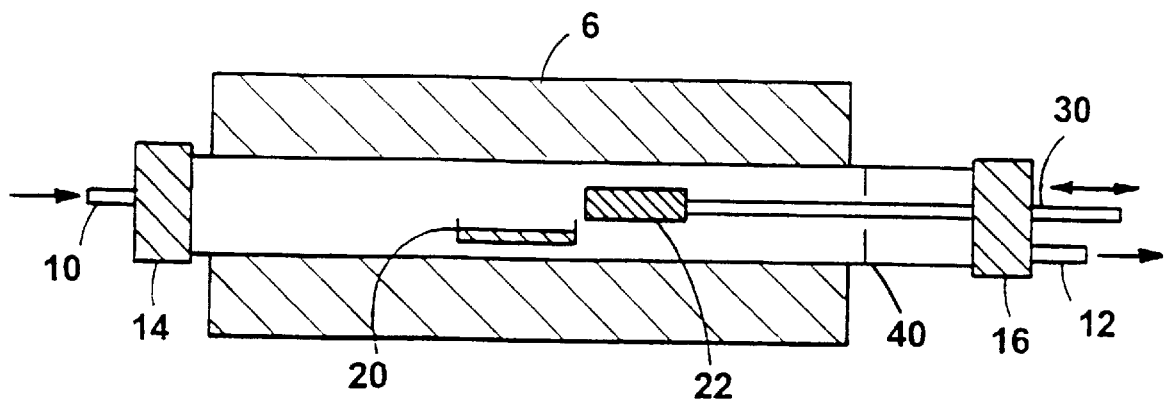
FIG. 2 is a schematic drawing of a quasi-continuous batch reactor for growth of metal oxide nanorods.

In a quasi-continuous batch-mode reactor, metal vapor (e.g., magnesium) can be generated by the carbothermal reduction of a metal oxide (e.g., magnesium oxide) and transported to a nanorod growth substrate (e.g., graphite) in the growth zone of the reactor. Referring to FIG. 2, inert gas (e.g., argon or helium) flows through high-purity quartz tube furnace 6 via inlet 10 and outlet 12 located in end caps 14 and 16, respectively, and over the metal vapor source 20 (e.g., MgO+carbon reactant in graphite boat). The metal oxide nanorods grow on nanorod growth substrate 22 (e.g., a carbon/graphite substrate such as a graphite rod), which is mounted on manipulator 30. The nanorod growth substrate can be a substrate that has been seeded with preformed nanoclusters or, preferably, forms nanosized nucleation sites in situ (e.g., graphite). The metal oxide nanorods grow on a surface of the nanorod growth substrate. After the set growth time, the substrate is removed (e.g., retracted) from the growth zone using manipulator 30. The resulting nanorods are removed from the substrate, for example, using scraper 40. The nanorods are collected for further use. The growth process can be continued by placing the nanorod growth substrate back into the growth zone of the reactor. It may be necessary to reseed the substrate before growing more nanorods on the surface. When a graphite substrate is used, it is not necessary to treat the substrate for nanorod growth.

Figure 3:
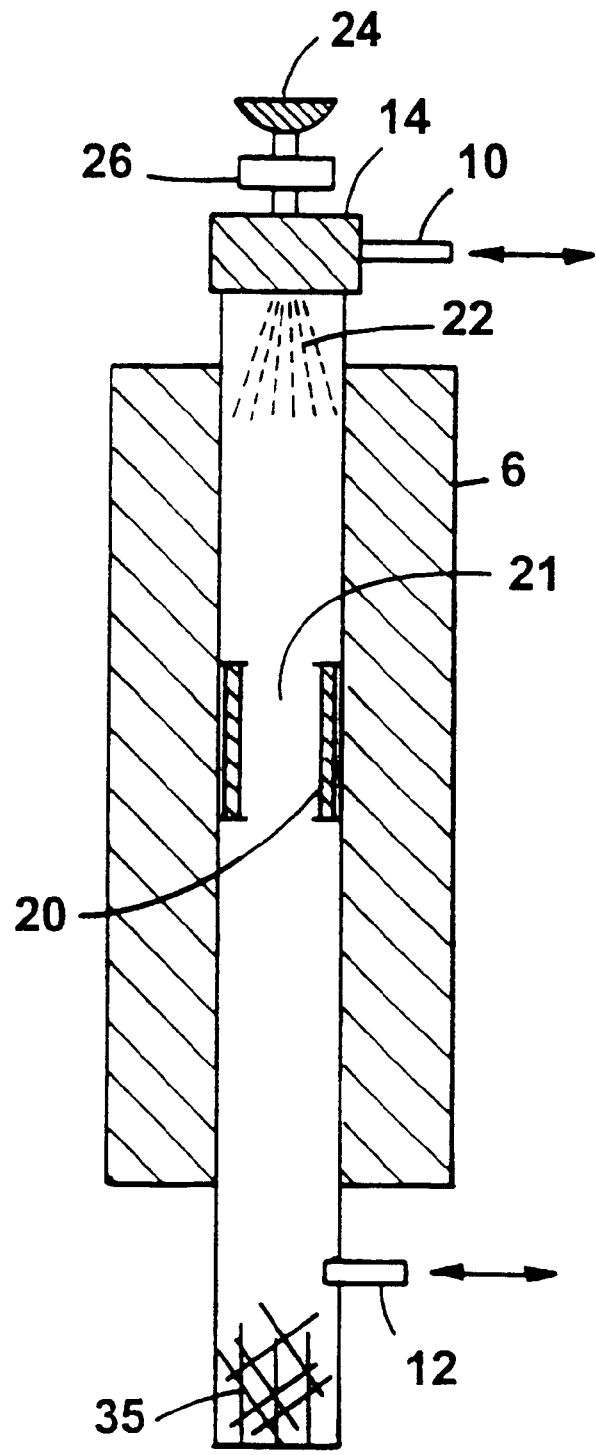
FIG. 3 is a schematic drawing of a continuous flow reactor for growth of metal oxide nanorods.

In a continuous flow reactor, powdered nanorod growth substrate (e.g., preformed metal oxide nanoclusters or graphite powder) are admitted and allowed to pass through the growth zone where metal vapor (e.g., Mg(0)) reacts and produces nanorods that are collected continuously at the bottom of the reactor. Referring to FIG. 3, inert gas (e.g., argon or helium) flows through vertical furnace 6 via inlet 10 and outlet 12. Inlet 10 is located in end caps 14 and outlet 12 is located at the opposite end of the furnace. The location of the metal vapor source 20 (e.g., MgO+carbon reactant in graphite boat) in the furnace defines growth zone 21, where the growth of the nanorods is controlled. In the continuous process, the nanorod growth substrate 22 is a powder, such as graphite powder or metal oxide nanoclusters. The powdered nanorod growth substrate is admitted from reservoir 24 through metering valve 26 into quartz tube in the a vertical tube furnace. The powdered substrate falls under the force of gravity through the growth zone 21 where the metal vapor (e.g., Mg(0)) is generated (e.g., by the carbothermal reduction of magnesium oxide). The rate at which the substrate falls through growth zone 21 can be controlled by inert gas flow through inlet 10 and outlet 12. The falling rate can be used to regulate growth of the nanorods. The metering rate can also be adjusted to alter the growth of the nanorods. The resulting nanorods are collected continuously in collector 35 at the bottom of the reactor. The continuous flow reactor can be used to prepare multigram to kilogram quantities of metal oxide nanorods.

The metal oxide nanorods formed using graphite substrates can be purified, for example, by oxidizing graphite to carbon dioxide gas in an oxygen-containing atmosphere (e.g., pure oxygen or air) at a temperature above about 600° C. It is important that the temperature be maintained below the sintering temperature of the metal oxide (e.g., 1800° C. for magnesium oxide). In addition, it is possible that homogeneous nucleation may produce greater quantities of undesirable metal oxide clusters in the submicron size range in the flow reactor than in the batch reactor. SEM and TEM can be used to identify the presence of metal oxide clusters, and conditions can be optimized to minimize the presence of these impurities. Furthermore, since the dimensions and flow characteristics of submicron clusters differ significantly from the nanorods, it is possible to physically remove these impurities using controlled porosity membrane filters. Membrane filtration for purification and separation of particles has been described, for example, in W. H. Sutton, "Principles and Methods for Fabricating Whisker-Reinforced Composite," in *Whisker Technology*, A. P. Levitt, Ed. (Wiley-Interscience, 1970, p. 315 and R. Lundberg, et al. "Processing of Whisker-reinforced ceramics," *Composites*, 18:125–127 (1987). Membrane filters can be used in large (kilogram) scale separations, and are a straightforward method for further mechanically purifying the metal oxide nanorods.

Uses of Metal Oxide Nanorods

The metal oxide nanorods can be used in the preparation of nanostructures having superior mechanical, electrical, optical and/or magnetic properties, such as high density magnetic recording media. The metal oxide nanorods can be used as abrasives or environmentally responsive ("smart") materials. The small diameters and high aspect ratios of the nanorods make them useful in metal, glass, organic polymer, and ceramic matrix composites. In particular, the metal oxide nanorods of the invention are useful as defects embedded within a superconductor.

For example, theoretical and experimental studies have demonstrated that columnar defects enhance critical current densities and shift the irreversibility line to higher temperatures in copper oxide superconductors due to strong pinning of magnetic flux-lines in the superconductors. The columnar defects should have diameters between 5 and 10 nm to maximize pinning while maintaining other desirable superconducting properties. Defects of these dimensions have been obtained by irradiating samples with high energy heavy ions or high energy protons. Pinning structures in superconductors are described in, for example, P. LeDoussal and D. R. Nelson, *Physica C* 232:69–74 (1994).

Nanorod-superconductor composites may be useful materials for superconducting wires used in power transmission and magnetic solenoids or thin film devices requiring large current densities and power throughputs such as send/receive filters in cellular communication base stations.

Metal Oxide Nanorod-Superconductor Composites

Metal oxide nanorod-superconductor composites can be made in bulk and film form (e.g., superconducting tapes, wires, cables, or films, such as in single and multifilament wires fabricated using BSCCO-2212 or BSCCO-2223). The composites have a columnar defect structure and enhanced critical current behavior. Composites can be prepared using MgO nanorods since these materials appear to react the least with high temperature superconductors such as $Bi_2Sr_2CaCu_2O_8$ (BSCCO-2212) superconductors, although it can be applied to other high temperature superconductors and BSCCO phases by simple modification of experimental conditions.

Bulk composite materials were made by combining nanorods and pre-reacted BSCCO powder. The resulting mixture is melt-textured on silver foil using procedures similar to making Ag/BSCCO tapes, as described in, for example, K. Nomara, et al., *Applied Physics Letters*, 62:2131–2133 (1993). TEM structural analysis of these bulk composites demonstrate that MgO nanorods are incorporated into crystal grains of BSCCO, and that nanorods are oriented principally perpendicular and parallel to the Cu—O planes of the superconductor.

Film composite materials were prepared by depositing amorphous BSCCO material at low temperature onto a MgO substrate containing aligned MgO nanorods with a rod density of $2 \times 10^9$ to $2 \times 10^{10}$ $cm^{-2}$. The composite was subsequently melt-textured thus causing crystallization and alignment of the BSCCO matrix. X-ray diffraction shows that the melt-textured BSCCO is aligned with the c-axis perpendicular to the substrate surface. In addition, TEM analysis demonstrates clearly that MgO nanorods pass through the BSCCO Cu—O planes, and have a size and density comparable to that of the starting substrate.

As expected, the critical current densities of the nanorod-BSCCO composites are enhanced dramatically compared to reference samples. The enhancements are comparable to those obtained previously using heavy-ion irradiation techniques (See, e.g., P. Kummeth, et al., *J. Alloys and Compounds* 195:403–406).

Without further elaboration, it is believed that one skilled in the art can, based on the description herein, utilize the present invention to its fullest extent. All publications cited herein are hereby incorporated by reference. The following specific examples are, therefore, to be construed as merely illustrative, and not limitive of the remainder of the disclosure.

EXAMPLE 1

Bulk Synthesis of MgO Nanorods on Nanoclusters

MgO powder and graphite powder were mixed in a weight ratio between 1:3 and 3:1. The resulting powder mixture was loaded into a graphite boat. The graphite boat was placed into a quartz tube flushing with Ar gas with a flow rate of between 100 and 2000 sccm. The gas contained between 1 and 10 ppm oxygen. The substrate was placed in the tube downstream of the graphite boat where the temperature gradient between the graphite boat and the substrate was less than 100° C. In the synthesis of bulk MgO nanorods, the substrate was composed of MgO nanoclusters with average diameters between 5 and 50 nm. The nanorods were obtained by heating the quartz tube to approximately 1200° C. for 0.5 to 2 hours.

The nanorods of MgO grew on the surface of the nanoclusters. The nanorods have diameters in the range from 5–100 nm depending on the reaction time, initial substrate nanocluster size and local supersaturation. The lengths of the nanorods ranges from 1–10 μm. The reaction times, initial nanocluster diameters and nanorod dimensions are listed in Table I.

TABLE I

| Nanocluster | Reaction | Nanorod | |
|---|---|---|---|
| Diameter (nm) | Time (min) | Diameter (nm) | Length (μm) |
| 5–50 | 30 | 10–50 | 1–10 |
| 5–50 | 60 | 50–100 | 1–10 |
| 30–150 | 60 | 50–150 | 1–10 |

EXAMPLE 1a

Bulk Synthesis of MgO Nanorods on Different Substrates

A mixture of MgO and graphite powder with a weight ratio of 1:3 to 3:1 was mixed by grinding, and placed in a graphite furnace boat. The graphite boat was placed into a quartz furnace tube and positioned at the center of a horizontal tube furnace. The tube containing the graphite boat and reactants was then flushed with argon gas at a flow rate between 100 and 2000 sccm. The substrate was placed downstream of the tube within −100° C. of the boat. In runs numbered 9 through 12, the surface of the MgO/C mixture acted as the substrate (i.e., no other substrate was included in the furnace. After loading the furnace, it was heated to a set point temperature between 1000° C. and 1200° C. measured at the center point of the furnace. The center point of the furnace was maintained at the set point temperature for times ranging from zero minutes up to 60 minutes (i.e., the hold time), depending on the substrate, at which time the contents of the furnace were cooled back to room temperature.

TABLE Ia

| No. | Substrate | Set Point Temperature (° C.) | Hold Time at Set Point (min) | Diameter (nm) | Length (μm) |
|---|---|---|---|---|---|
| 1 | Highly Oriented Pyrolytic Graphite | 1200 | 0 | 5–90 | 1-5 |
| 2 | Carbon Plate Graphite Sheet | 1150 | 0 | 5–80 | 1–5 |
| 3 | Carbon Plate Graphite Sheet | 1200 | 0 | 20–150 | 1–10 |
| 4 | Carbon Plate Graphite Sheet | 1200 | 30 | 50–200 | 1–50 |
| 5 | Au/Graphite Sheet | 1125 | 0 | 5–100 | 1–5 |
| 6 | Au/Graphite Sheet | 1200 | 0 | 5–150 | 1–10 |
| 7 | Au/MgO | 1125 | 0 | 5–40 | 1–5 |
| 8 | Au/Etched MgO | 1125 | 0 | 5–40 | 1–5 |
| 9 | Surface of MgO/C Mixture | 1100 | 60 | 50–200 | 1–200 |
| 10 | Surface of MgO/C Mixture | 1125 | 0 | 5–100 | 1–5 |
| 11 | Surface of MgO/C Mixture | 1200 | 0 | 5–100 | 1–5 |
| 12 | Surface of MgO/C Mixture | 1200 | 60 | 50–200 | 1–200 |

The diameters and lengths of the nanorods were measured and are summarized along with types of substrates and reaction conditions in Table Ia. For example, the nanorods grown on the graphite plate have diameters ranging from 5 nm to 200 nm and have aspect ratios typically of 50 to 1000. Smaller diameters can be favored by reducing the reaction time (e.g., to 0–10 minutes from 30 minutes). The packing density of nanorods on the surface of the gold coated etched magnesium oxide substrate (No. 8) was $2 \times 10^{10}$ cm$^{-2}$.

EXAMPLE 2

MgO nanorods Aligned on a Substrate Surface

The nanorods were prepared by the methods described in Example 1, except in order to obtain nanorods aligned on a substrate surface, a single crystal that has been freshly etched was used as the substrate. Specifically, the substrate was the (100) face of a MgO single crystal which was etched with 0.1 to 0.5 M aqueous NiCl$_2$ solution for 0.25 to 2 hours. The substrate was placed in the furnace immediately after etching. The etching time effects the density of the nanorods on the surface. Typically, etching times of 0.5 hours and etching solution concentrations of 0.5 M are used.

The nanorods grown on the single crystal surface are relatively uniform in diameter and length. The diameter ranges from 10 to 30 nm the length varies from and 1 to 2 μm. The nanorods are oriented on the crystal surface. Most (e.g., greater than 50%, more preferably greater than 80%) of the nanorods are perpendicular to the (100) surface while the others are at a 450 angle to the substrate surface. The packing density of the nanorods on the surface is between $1 \times 10^7$ and $5 \times 10^9$ cm$^{-2}$ depending on the concentration of the etching solution and the etching time. Particular etching times, etching solution concentrations and nanorod densities are listed in Table II.

TABLE II

| Etching Time (min) | Density of nanorods (cm$^2$) |
|---|---|
| 0 | $5 \times 10^8$ |
| 15 | $1 \times 10^9$ |
| 30 | $5 \times 10^9$ |

Note: The etching solution concentration was 0.5 M.

EXAMPLE 3

Bulk Synthesis of Al$_2$O$_3$ Nanorods

Al$_2$O$_3$ powder and graphite powder were mixed in a weight ratio of between 1:3 and 3:1. The mixture was loaded into a graphite boat. The graphite boat was put into a alumina tube flushing with Ar gas at a flow rate between 100 and 2000 sccm. The gas contained between 1 and 10 ppm oxygen. Al$_2$O$_3$ nanoclusters with average diameters between 5 and 10 nm were put downstream of the graphite boat where the temperature gradient between the graphite boat and the substrate was 100° C. The tube was heated to 1400° C. for 0.5 to 2 hr to generate the nanorods.

The nanorods of Al$_2$O$_3$ collected on the surface of nanoclusters. The nanorods have diameters ranging from 5 to 100 nm and lengths ranging from 1 to 10 $\mu$m.

EXAMPLE 4

ZnO Nanorods Aligned on a Substrate Surface

ZnO powder and graphite powder was mixed in a weight ratio 1:3 to 3:1. The mixture was loaded into a graphite boat which was placed into a quartz tube being flushed with Ar gas with a flow rate between 100 and 2000 sccm. The gas contained between 1 and 10 ppm oxygen. A (100) SrTiO$_3$ single crystal substrate coated with a film of gold with a thickness between 1 and 100 nm was placed in the tube downstream of the graphite boat where the temperature gradient between the graphite boat and the substrate was approximately 300° C. The quartz tube was heated to between 900° C. and 1000° C. for between 0.25 to 1 hour to grow the nanorods.

Alternatively, zinc metal can be used as the metal vapor source, in which case the tube furnace was heated to between 500° C. and 700° C.

The nanorods grown on the single crystal surface were uniform in diameter and length, ranging from 10 to 50 nm and 1 to 2 $\mu$m, respectively. Nearly all of the nanorods were oriented relative to the crystal surface, but were not normal to the surface.

EXAMPLE 5

Bulk Nanorod-Superconductor Composites

MgO nanorods with diameters between 10 and 100 nm and lengths between 1 and 10 $\mu$m were mixed and ground with pre-reacted BSCCO(2212) powder. The mixture contained between 0 and 15 percent nanorods by weight. The fine powder mixture was pressed into a pellet using a pellet compressor (e.g., 10 tons over a 20 mm diameter die). The resulting pellet was placed onto the surface of Ag foil and was heated to between 860 and 880° C. The material was maintained in this partially melted state for between 10 and 30 minutes. The temperature was decreased at a rate of between 1 and 5° C. per hour to between 760 and 800° C. The material was held at this temperature for between 10 and 24 hours at which time the sample was cooled down to room temperature to yield the final composite. The composite had much higher critical current densities than a reference sample processed in a similar manner that did not contain the MgO nanorods. At 5K, 0 Tesla, the critical current density of the composite in comparison to a reference sample lacking nanorods increased from $2 \times 10^4$ to $2 \times 10^5$ A cm$^{-2}$, and at 30K, 0 Tesla, it increased from $4 \times 10^3$ to $5 \times 10^4$ A cm$^{-2}$. Over the temperature range of 5 to 60K, there was a one magnitude increase in critical current density.

EXAMPLE 6

Film Nanorod-Superconductor Composites

The MgO nanorods were first grown on the (100) surface of a MgO single crystal substrate as described above in Example 2. Amorphous BSCCO(2212) was deposited on the substrate using pulsed laser deposition at room temperature. Pulsed laser deposition is described in, for example, S. Zhu, et al., *Applied Physics Letters*, 63:409–411 (1993). The amorphous composite was subsequently melt-textured using the heating program described for the bulk composite in Example 5 to afford the final film composite material. The critical current density of the film composite is much greater than that of a reference sample without nanorods. At 5K, 0.8 Tesla, the critical current density of the composite in comparison to a reference sample lacking nanorods increased from $2 \times 10^4$ to $1.5 \times 10^5$ A cm$^{-2}$ at 40K, 0.5 Tesla, it increased from $1 \times 10^3$ to $2 \times 10^4$ A cm$^{-2}$, and at 60K, 0.15 Tesla, it increased from $8 \times 10^2$ to $1 \times 10^4$ A cm$^{-2}$.

EXAMPLE 7

MgO Nanorod/Tl$_2$Ba$_2$Ca$_2$Cu$_3$O$_{10}$ Composite

The MgO nanorod array was first grown on the (100) surface of a MgO single crystal substrate as described above in Example 2. Amorphous Ba$_2$Ca$_2$Cu$_3$O$_7$ was deposited on onto the MgO nanorod forest using pulsed laser deposition at 200° C. Then, the sample was thallinated and crystallized to form the Tl$_2$Ba$_2$Ca$_2$Cu$_3$O$_{10}$ superconductor in a three-zone furnace. During the thallination, the sample is sealed in Ag foil with a small amount of Tl$_2$Ba$_2$Ca$_2$Cu$_3$O$_{10}$ powder and placed at one end of an alumina tube. The Tl source (Tl$_2$O$_3$) was placed at the other end of the alumina tube. The alumina tube was half sealed with Ag foil and placed into the three-zone furnace. The sample temperature was kept at 790° C. and the Tl source temperature was maintained at 890° C. This thallination process is described in, for example, W. L. Holstein, et al., *J. Mater. Res.*, 11(6):1349 (1996). The critical current density of the final film composite was much greater than that of a reference sample without nanorods. At 50K, 0.4 Tesla, the critical current density of the composite in comparison to a reference sample lacking nanorods increased from $1 \times 10^3$ to $2 \times 10^4$ A cm$^{-2}$, at 60K, 0.3 Tesla, it increased from $1 \times 10^3$ to $1.5 \times 10^4$ A cm$^{-2}$, and at 90K, 0.15 Tesla, it increased from 100 to 7000 A cm$^{-2}$.

OTHER EMBODIMENTS

From the above description, the essential characteristics of the present invention can be ascertained. Without departing from the spirit and scope thereof, various changes and modifications of the invention can be made to adapt it to various usages and conditions. Thus, other embodiments are also within the claims.

What is claimed is:

1. A method of producing metal oxide nanorods comprising:
   generating a metal vapor in a furnace;
   exposing a nanorod growth substrate to the metal vapor within a growth zone in the furnace for a sufficient time to form metal oxide nanorods on a surface of the nanorod growth substrate;
   removing the nanorod growth substrate from the growth zone; and
   collecting the metal oxide nanorods thus formed, each nanorod having a diameter between 1 and 200 nm.

2. The method of claim 1, wherein the growth zone is a region within a 100° C. temperature drop between a location of highest metal vapor concentration and a location of the substrate.

3. The method of claim 1, wherein the nanorod growth substrate is a metal oxide nanocluster, a single crystal, graphite, or a metal coated substrate.

4. The method of claim 3, wherein the growth zone is a region within a 100° C. temperature drop between a location of highest metal vapor concentration and a location of the substrate.

5. The method of claim 4, wherein the metal vapor source comprises magnesium.

6. The method of claim 5, further comprising mechanically separating the metal oxide nanorods from the substrate.

7. The method of claim 5, wherein the nanorod growth substrate is graphite.

8. The method of claim 7, further comprising purifying the metal oxide nanorods by heating the metal oxide nanorods in an oxidizing atmosphere to convert the graphite to carbon dioxide.

9. The method of claim 1, further comprising the step of moving the nanorod growth substrate through the growth zone during the exposing step.

10. A method of producing metal oxide nanorods comprising:
    placing a metal vapor source in a furnace;
    providing a nanorod growth substrate in the furnace;
    heating the metal vapor source to a temperature between 500° C. and 1600° C.;
    maintaining the temperature for a sufficient time to form metal oxide nanorods on a surface of the nanorod growth substrate; and
    collecting the metal oxide nanorods thus formed, each nanorod having a diameter between 1 and 200 nm.

11. The method of claim 10, further comprising flowing a carrier gas through the furnace.

12. The method of claim 11, wherein providing the nanorod growth substrate comprises placing the nanorod growth substrate downstream of the metal vapor source.

13. The method of claim 10, wherein providing the nanorod growth substrate comprises placing the nanorod growth substrate within a growth zone.

14. The method of claim 13, wherein the growth zone is a region within a 100° C. temperature gradient drop between the metal vapor source and the substrate when heated to the temperature between 500° C. and 1600° C.

15. The method of claim 14, further comprising removing the nanorod growth substrate from the growth zone after the sufficient time to form metal oxide nanorods on a surface of the nanorod growth substrate.

16. The method of claim 15, further comprising mechanically separating the metal oxide nanorods from the substrate.

17. The method of claim 15, wherein the nanorod growth substrate is graphite.

18. The method of claim 17, further comprising purifying the metal oxide nanorods by heating the metal oxide nanorods in an oxidizing atmosphere to convert the graphite to carbon dioxide.

19. The method of claim 18, wherein the metal oxide is magnesium oxide.

20. The method of claim 15, further comprising moving the nanorod growth substrate through the growth zone during the sufficient time to form the metal oxide nanorods.

21. The method of claim 10, further comprising cooling the metal vapor source to stop the formation of the metal oxide nanorods.

22. The method of claim 10, wherein the metal vapor source comprises an elemental metal or a mixture of metal oxide and carbon, wherein the metal is selected from the group consisting of titanium, zirconium, hafnium, vanadium, niobium, tantalum, chromium, molybdenum, tungsten, manganese, technetium, rhenium, iron, osmium, cobalt, nickel, copper, zinc, scandium, yttrium, lanthanum, a lanthanide series element, boron, aluminum, gallium, indium, thallium, silicon, germanium, tin, lead, magnesium, calcium, strontium, and barium.

23. The method of claim 10, wherein the nanorod growth substrate comprises a metal oxide nanocluster, a surface of the metal vapor source, a single crystal, graphite, or a metal coated substrate.

24. The method of claim 22, wherein said metal oxide is magnesium oxide.

25. A method of producing magnesium oxide nanorods comprising:
    placing a magnesium vapor source in a furnace;
    providing a nanorod growth substrate in the furnace;
    generating a magnesium vapor in the furnace by heating the magnesium vapor source to a temperature between 500° C. and 1600° C.;
    exposing the nanorod growth substrate to the magnesium vapor within a growth zone in the furnace for a sufficient time to form magnesium oxide nanorods on a surface of the nanorod growth substrate, the growth zone being a region in the furnace within a 100° C. temperature drop of the magnesium vapor source;
    removing the nanorod growth substrate from the growth zone after the sufficient time to grow metal oxide nanorods on a surface of the nanorod growth substrate; and
    collecting the magnesium oxide nanorods thus formed.

26. The method of claim 25, wherein the nanorod growth substrate is graphite, metal coated substrate, a surface of the magnesium vapor source, or a magnesium oxide nanocluster.

27. The method of claim 26, wherein the nanorod growth substrate is graphite.

28. The method of claim 27, further comprising purifying the metal oxide nanorods by heating the metal oxide nanorods in an oxidizing atmosphere to convert the graphite to carbon dioxide.

29. The method of claim 28, further comprising moving the nanorod growth substrate through the growth zone during the exposing step.

30. The method of claim 29, further comprising mechanically separating the metal oxide nanorods from the substrate.

31. A method of producing metal oxide nanorods comprising:
    generating a metal vapor in a furnace;

exposing a nanorod growth substrate to the metal vapor within a growth zone in the furnace for a sufficient time to form metal oxide nanorods on a surface of the nanorod growth substrate;

removing the nanorod growth substrate from the growth zone; and collecting the metal oxide nanorods thus formed, wherein said metal oxide is magnesium oxide.

32. A method of producing metal oxide nanorods comprising:

placing a metal vapor source in a furnace;

providing a nanorod growth substrate in the furnace;

heating the metal vapor source to a temperature between 500° C. and 1600° C.;

maintaining the temperature for a sufficient time to form metal oxide nanorods on a surface of the nanorod growth substrate; and collecting the metal oxide nanorods thus formed, wherein said metal oxide is magnesium oxide.

33. The method of claim 1, wherein said metal oxide nanorod is aligned relative to a surface of the substrate.

34. The method of claim 10, wherein said metal oxide nanorod is aligned relative to a surface of the substrate.

* * * * *

UNITED STATES PATENT AND TRADEMARK OFFICE
CERTIFICATE OF CORRECTION

PATENT NO.   : 6,036,774
DATED        : March 14, 2000
INVENTOR(S)  : Charles M. Lieber and Peidong Yang It is certified that error appears in the above-identified patent and that said Letters Patent is hereby corrected as shown below:

Col. 10, line 62, "450" should be --45°--.

Signed and Sealed this

Thirteenth Day of March, 2001

Attest:

NICHOLAS P. GODICI

Attesting Officer    Acting Director of the United States Patent and Trademark Office